US012218044B2

(12) United States Patent
Kinoshita et al.

(10) Patent No.: US 12,218,044 B2
(45) Date of Patent: Feb. 4, 2025

(54) SEMICONDUCTOR DEVICE

(71) Applicant: RENESAS ELECTRONICS CORPORATION, Tokyo (JP)

(72) Inventors: Nobuhiro Kinoshita, Tokyo (JP);
Shuuichi Kariyazaki, Tokyo (JP);
Keita Tsuchiya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 394 days.

(21) Appl. No.: 17/722,823

(22) Filed: Apr. 18, 2022

(65) Prior Publication Data

US 2022/0406700 A1 Dec. 22, 2022

(30) Foreign Application Priority Data

Jun. 16, 2021 (JP) ................... 2021-100071

(51) Int. Cl.
*H01L 23/48* (2006.01)
*H01L 23/498* (2006.01)
(Continued)

(52) U.S. Cl.
CPC .. *H01L 23/49838* (2013.01); *H01L 23/49816* (2013.01); *H01L 23/49822* (2013.01);
(Continued)

(58) Field of Classification Search
CPC ....... H01L 23/3128; H01L 2224/16227; H01L 2224/73204
(Continued)

(56) References Cited

U.S. PATENT DOCUMENTS 8,536,047 B2* 9/2013 Zhang ..................... H01L 24/81
257/781
8,729,680 B2* 5/2014 Kobayashi ........ H01L 23/49827
257/664

(Continued)

FOREIGN PATENT DOCUMENTS

JP 2010-267712 A 11/2010
JP 2012-209418 A 10/2012
(Continued)

OTHER PUBLICATIONS

Office Action dated Jul. 23, 2024 from corresponding Japanese Patent Application No. 2021-100071, 13 pages.

*Primary Examiner* — Nitin Parekh
(74) *Attorney, Agent, or Firm* — Rimon P.C.

(57) ABSTRACT

A wiring substrate includes: a first insulating layer; a first metal pattern formed on the first insulating layer; a second insulating layer formed on the first insulating layer so as to cover the first metal pattern; a second metal pattern formed on the second insulating layer; and an organic insulating film contacted with a portion of the second metal pattern. The first metal pattern has: a first lower surface contacted with the first insulating layer; and a first upper surface contacted with the second insulating layer. The second metal pattern has: a second lower surface contacted with the second insulating layer; and a second upper surface contacted with the organic insulating film. Further, a surface roughness of the second upper surface is larger than a surface roughness of each of the second lower surface, the first upper surface and the first lower surface.

13 Claims, 12 Drawing Sheets

(51) Int. Cl.
*H01L 23/66* (2006.01)
*H01L 23/00* (2006.01)
*H01L 23/538* (2006.01)
*H01L 25/065* (2023.01)

(52) U.S. Cl.
CPC ........ *H01L 23/49894* (2013.01); *H01L 23/66* (2013.01); *H01L 23/5385* (2013.01); *H01L 23/5386* (2013.01); *H01L 24/16* (2013.01); *H01L 24/32* (2013.01); *H01L 24/73* (2013.01); *H01L 25/0655* (2013.01); *H01L 2223/6616* (2013.01); *H01L 2223/6627* (2013.01); *H01L 2224/16227* (2013.01); *H01L 2224/16237* (2013.01); *H01L 2224/32225* (2013.01); *H01L 2224/73204* (2013.01); *H01L 2924/1616* (2013.01); *H01L 2924/16251* (2013.01); *H01L 2924/1632* (2013.01); *H01L 2924/3511* (2013.01); *H01L 2924/35121* (2013.01)

(58) Field of Classification Search
USPC .......................................... 257/758, 773, 786
See application file for complete search history.

(56) References Cited

U.S. PATENT DOCUMENTS

| | | | |
|---|---|---|---|
| 8,841,209 B2* | 9/2014 | Allard | H05K 3/4682 |
| | | | 438/618 |
| 8,980,691 B2* | 3/2015 | Lin | H01L 25/50 |
| | | | 438/666 |
| 9,337,134 B2 | 5/2016 | Oyachi et al. | |
| 2003/0155642 A1* | 8/2003 | Davis | H01L 23/5226 |
| | | | 257/E23.145 |
| 2010/0059883 A1* | 3/2010 | Yow | H01L 24/85 |
| | | | 257/738 |
| 2015/0034366 A1* | 2/2015 | Yoshioka | H05K 3/0079 |
| | | | 174/251 |
| 2019/0131241 A1* | 5/2019 | Jeng | H01L 25/105 |
| 2021/0028098 A1* | 1/2021 | Yoo | H01L 21/4857 |
| 2021/0159280 A1* | 5/2021 | Ye | H10K 50/11 |

FOREIGN PATENT DOCUMENTS

| | | |
|---|---|---|
| JP | 2014-236056 A | 12/2014 |
| JP | 2016-066733 A | 4/2016 |
| JP | 2020-136635 A | 8/2020 |

* cited by examiner

SEMICONDUCTOR DEVICE

CROSS-REFERENCE TO RELATED APPLICATIONS

The disclosure of Japanese Patent Application No. 2021-100071 filed on Jun. 16, 2021 including the specification, drawings and abstract is incorporated herein by reference in its entirety.

BACKGROUND

The present invention relates to a semiconductor device. Here, there are disclosed techniques listed below.
[Patent Document 1] Japanese Unexamined Patent Application Publication No. 2014-236056

There is a technique of roughening a surface of a metal film from the viewpoint of improving an adhesion between a metal film and an adhesive material which is in contact with the metal film (see, for example, Patent Document 1).

SUMMARY

As one of demands for improving a performance of a semiconductor device, there is a demand for high-speed transmission of an electric signal, or a demand for miniaturization of the semiconductor device. However, if implementing the high-speed transmission, then it causes that a size of the semiconductor device is increased. In order to suppress that the size of the semiconductor device is increased in accordance with the high-speed transmission, a technique for arranging a large number of signal transmission paths at high density, in other words, a technique that can prevent a short circuit between adjacent terminals even if a large number of terminals are arranged at high density is required.

Other objects and novel features will become apparent from the description of this specification and the accompanying drawings.

A semiconductor device according to one embodiment, including: a semiconductor chip having a first surface on which a protruding electrode is disposed; and a wiring substrate having a second surface facing the first surface of the semiconductor chip. Here, the wiring substrate includes: a first insulating layer; a first metal pattern formed on the first insulating layer; a second insulating layer contacted with the first metal pattern, and formed on the first insulating layer so as to cover the first metal pattern; a second metal pattern having a first portion facing the protruding electrode and a second portion located around the first portion, and formed on the second insulating layer; and an organic insulating film contacted with the second portion of the second metal pattern, and formed on the second insulating layer so as to expose the first portion of the second metal pattern. Also, the first metal pattern has: a first lower surface contacted with the first insulating layer; and a first upper surface opposite the first lower surface, and contacted with the second insulating layer. Also, the second metal pattern has: a second lower surface contacted with the second insulating layer, and a second upper surface contacted with the organic insulating film at the second portion. Further, a surface roughness of the second upper surface of the second metal pattern is larger than a surface roughness of each of the second lower surface of the second metal pattern, the first upper surface of the first metal pattern and the first lower surface of the first metal pattern.

According to the above one embodiment, the performance of the semiconductor device can be improved.

Figure 1:
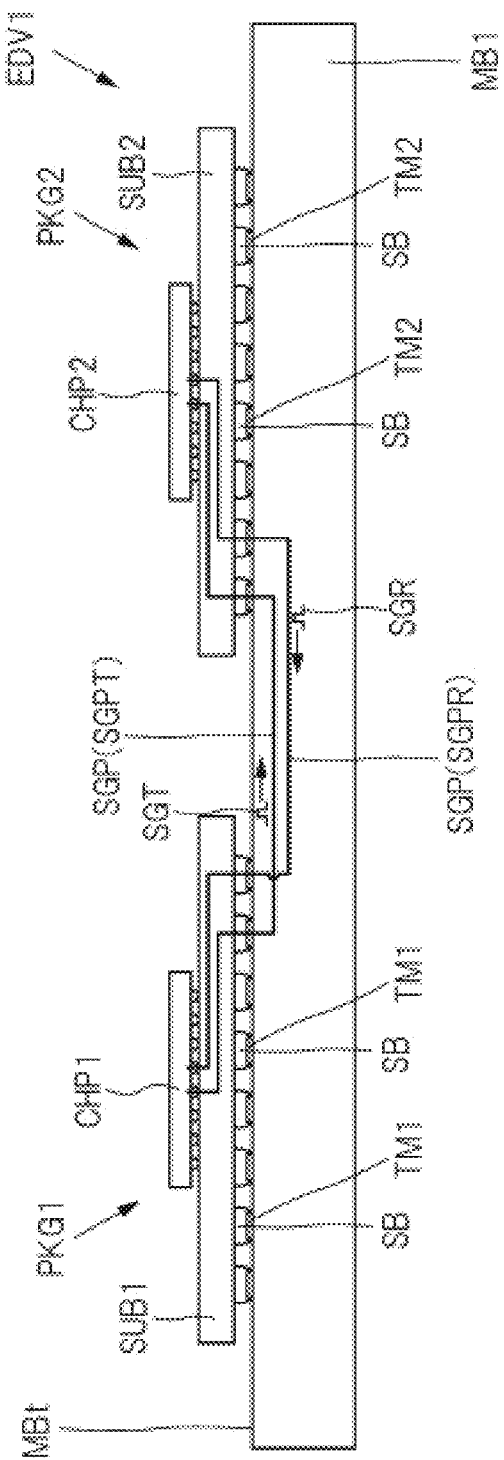
FIG. 1 is an explanatory view showing a configuration example of an electronic device including a semiconductor device according to one embodiment.

DETAILED DESCRIPTION (Descriptions of Form, Basic Term, and Usage in Present Application)

In the present application, the description of the embodiment will be divided into a plurality of sections or the like as required for convenience, but unless expressly stated otherwise, these are not independent of each other, and each part of a single example, one of which is a partial detail or a part or all of the other, whether before or after the description, or the like, is modified example or the like. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case. For example, regarding a component, it means "X including A as a main component" or the like. For example, the term "silicon member" or the like is not limited to pure silicon, and it is needless to say that it also includes a member containing a SiGe (silicon-germanium) alloy, a multi-element alloy containing silicon as its main component, other additives, or the like. In addition, the term gold plating, Cu layer, nickel plating, or the like includes not only pure components, but also members containing gold, Cu, nickel, or the like as main components, except when it is clearly stated that this is not the case.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching or dot patterns may be added to indicate that the region is not a void even if it is not a cross-section or to indicate the boundary of the area.

<Electronic Device>

Figure 2:
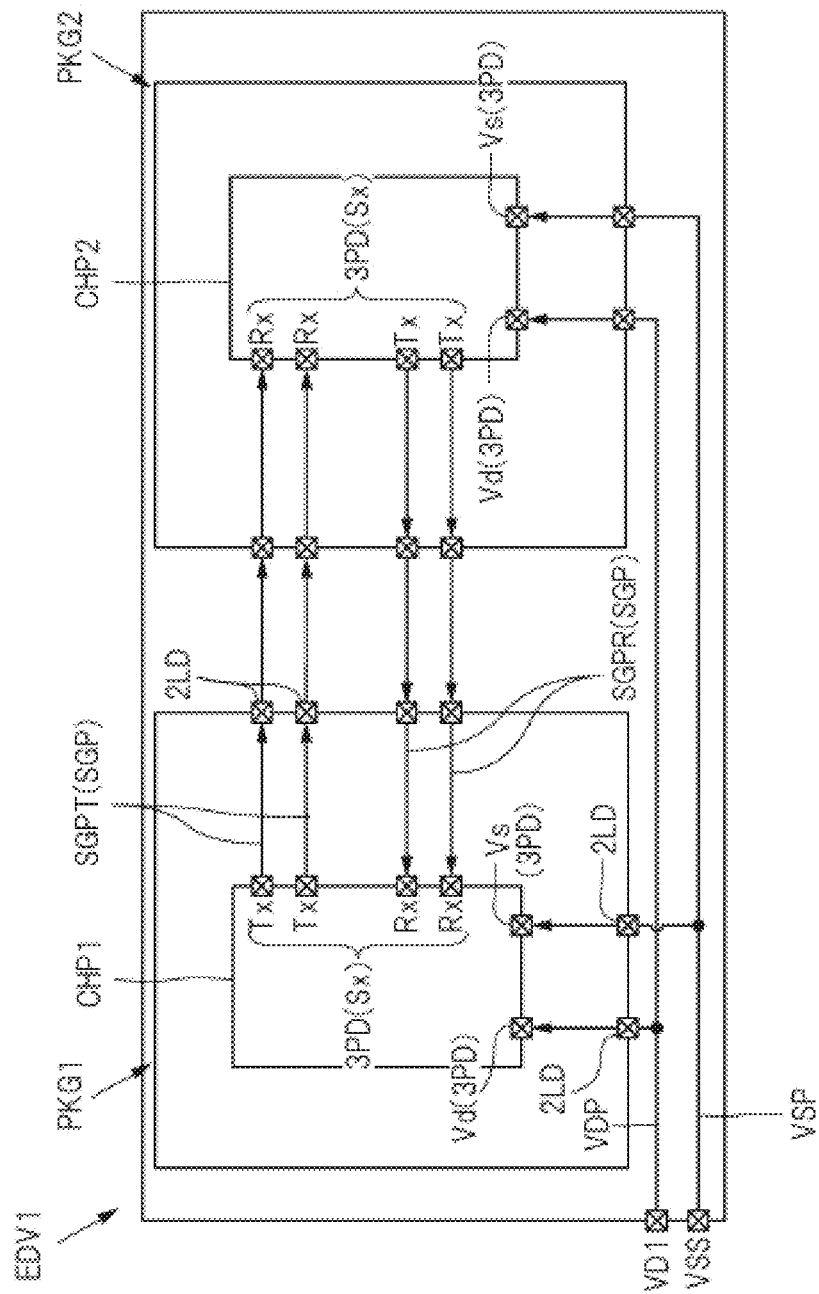
FIG. 2 is an explanatory view showing a configuration example of a circuit of the electronic device shown in FIG. 1.

First, with reference to FIGS. 1 and 2, an example of usage of a semiconductor device of the present embodiment described below will be explained. FIG. 1 is an explanatory view showing a configuration example of an electronic device including a semiconductor device according to the present embodiment. Further, FIG. 2 is an explanatory view showing a configuration example of a circuit of the electronic device shown in FIG. 1. Incidentally, in FIG. 1, in order to explicitly indicate that semiconductor device PKG1 and semiconductor device PKG2 are electrically connected, schematically showing the signal transmission path SGP shown in FIG. 2 by a thick line.

The electronic device (electronics) EDV1 shown in FIG. 1 has a wiring substrate (motherboard, mounting substrate) MB1 and semiconductor device PKG1 and semiconductor device PKG2 mounted on the wiring substrate MB1. Semiconductor device PKG1 and semiconductor device PKG2, via the signal transmission path SGP formed in the wire substrate MB1, are connected to each other, and electrically. The signal transmitted through the signal transmission path SGP includes a signal SGT output from semiconductor device PKG1 and a signal SGR input to semiconductor device PKG1. Further, the signal transmission path SGP includes a signal transmission path SGPT signal SGT is transmitted, and a signal transmission path SGPR signal SGR is transmitted.

In the exemplary embodiment shown in FIG. 1, the signal SGT is output from semiconductor device PKG1, and is input to semiconductor device PKG2. The signal SGR is outputted from semiconductor device PKG2, and the signal SGR is inputted to semiconductor device PKG1. However, the output destination of the signal SGT and the output source of the signal SGR is not limited to the example shown in FIG. 1, there are various modified example. Since semiconductor device PKG1 and semiconductor device PKG2 shown in FIG. 1 have the same structures, semiconductor device PKG1 will be described below as a typical example.

As shown in FIG. 2, the electronic device EDV1 has a plurality of signal transmission paths SGP. Signal transmission path SGP, for example, a signal is transmitted at a transmission rate above 15 Gbps (Gigabit per second), a high-speed transmission path (high-speed signal transmission path). Incidentally, when realizing the transmission rate of 15 Gbps by one signal transmission path, for example, the frequency of the electric signal flowing through the signal transmission path SGP is required to be 30 GHz (gigahertz) or more. Further, in the present embodiment, as an example of a signal transmission path SGP is a high-speed transmission path, different signals are transmitted to each of the plurality of signal transmission path SGP, so-called, will be described taking a transmission path of the single-ended structure. However, the technique described below transmits one signal via a pair of signal transmission paths constituting the differential pair, it can also be applied to the transmission path of the differential system.

As shown in FIG. 2, the semiconductor chip semiconductor device PKG1 has (semiconductor component, electronic component) CHP1 includes a plurality of electrodes (electrode terminals). A plurality of electrodes semiconductor chip CHP1 has a signal SOT is an output signal (transmission signal) (see FIG. 1) includes a signal electrode to be transmitted (signal electrode terminal) Tx. Further, a plurality of electrodes semiconductor chip CHP1 has includes a signal electrode (signal electrode terminal) Rx signal SGR (refer to FIG. 1) is an input signal (received signal) is transmitted. In the following, as a generic name of the signal electrode Tx or the signal electrode Rx, may be described as a signal electrode Sx.

In FIG. 2, among the plurality of signal transmission path SGP semiconductor device PKG1 is provided, typically shows two output signal transmission path SGPT and two input signal transmission path SGPR. However, the number of signaling paths SGPs included in semiconductor device PKG1 is larger than the number shown in FIG. 2.

Further, a plurality of electrodes having the semiconductor chip CHP1 includes an electrode reference potential (first potential) VSS is supplied (reference potential electrode, the first potential electrode) Vs, an electrode power supply potential (second potential) VDD is supplied (power supply potential electrode, the second potential electrode) Vd, a. The electrode Vs constitutes a part of the reference potential supply path VSP. Electrode Vd constitutes a portion of the power supply potential supply path VDP. The semiconductor chip CHP1 (specifically, the circuit provided by the semiconductor chip CHP1), the power supply potential VDD is supplied via the electrode Vd. Further, the semiconductor chip CHP1 (specifically, the circuit provided by the semiconductor chip CHP1), the reference potential VSS is supplied via the electrode Vs. At least a portion of the plurality of circuits semiconductor chip CHP1 is provided is driven by a driving voltage generated by the potential difference between the power supply potential VDD and the reference potential VSS. The reference potential VSS is, for example, a ground potential, the power supply potential VDD is higher than the reference potential VSS.

<Semiconductor Device>

Figure 3:
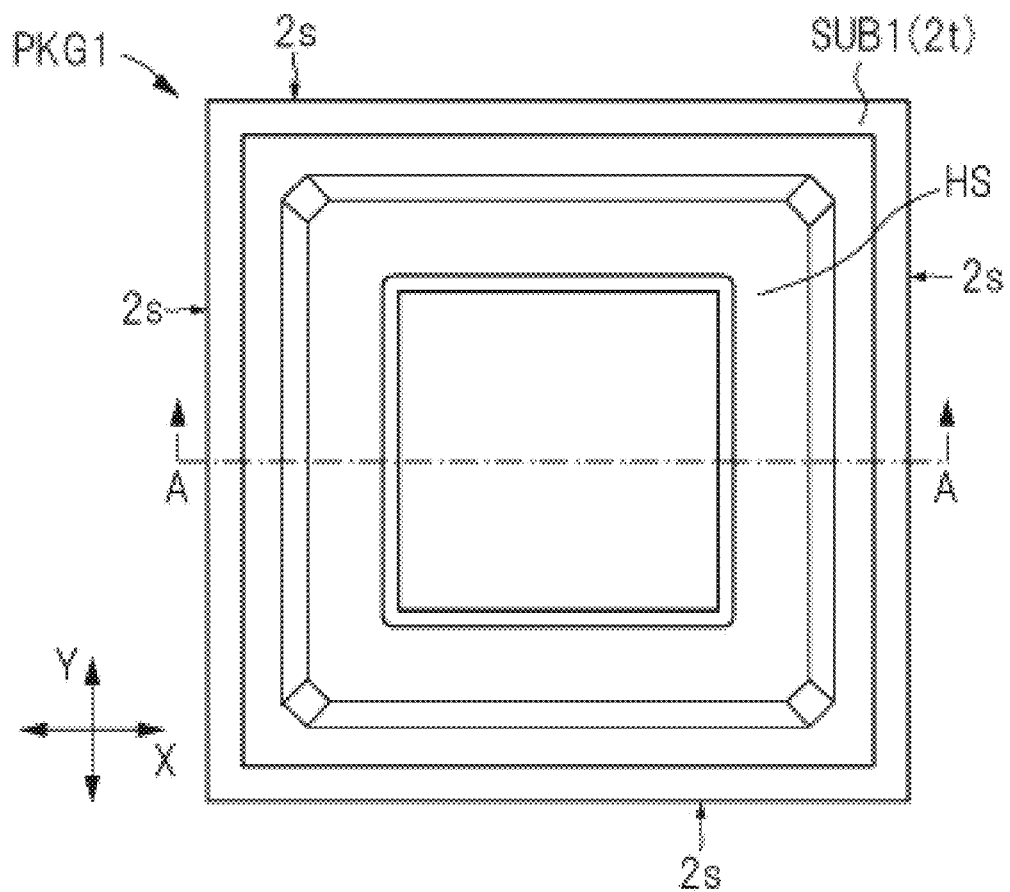
FIG. 3 is an upper surface view of one of two semiconductor devices shown in FIG. 1.
Figure 4:
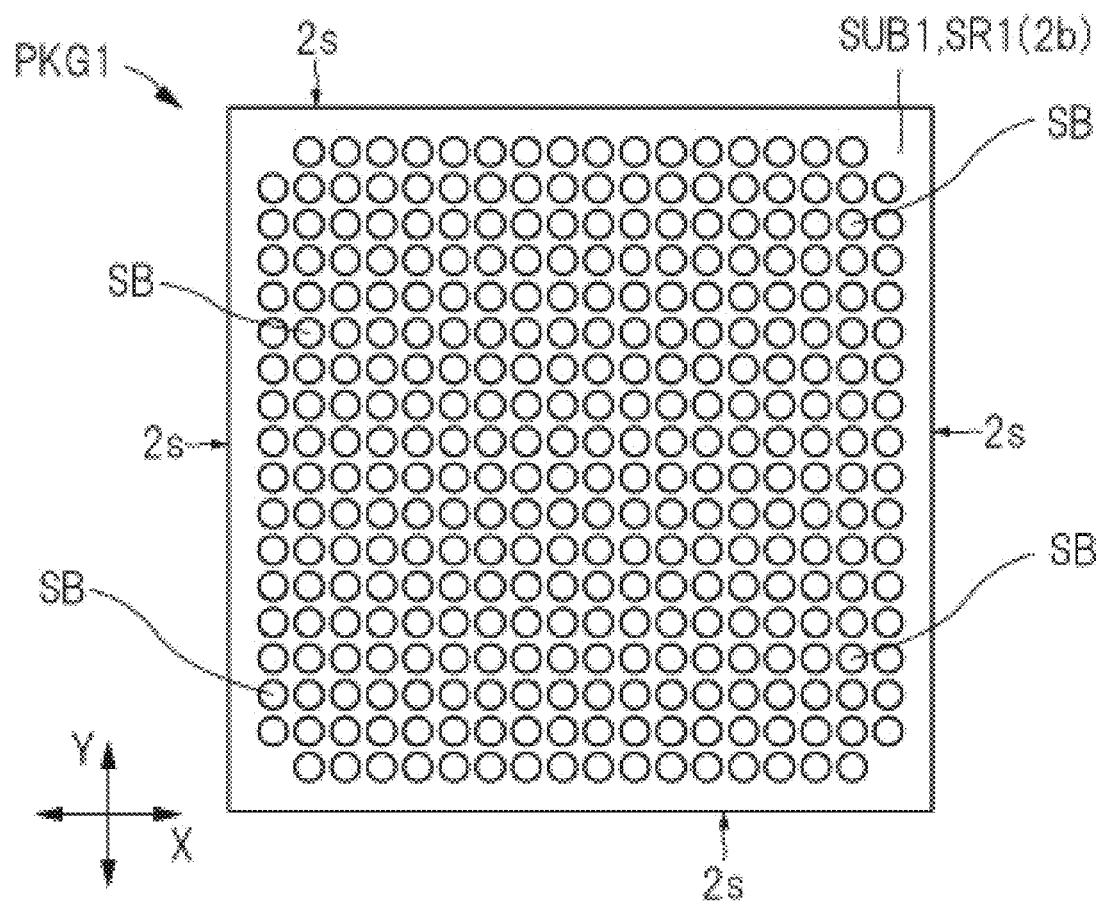
FIG. 4 is a lower surface view of the semiconductor device shown in FIG. 3.
Figure 5:
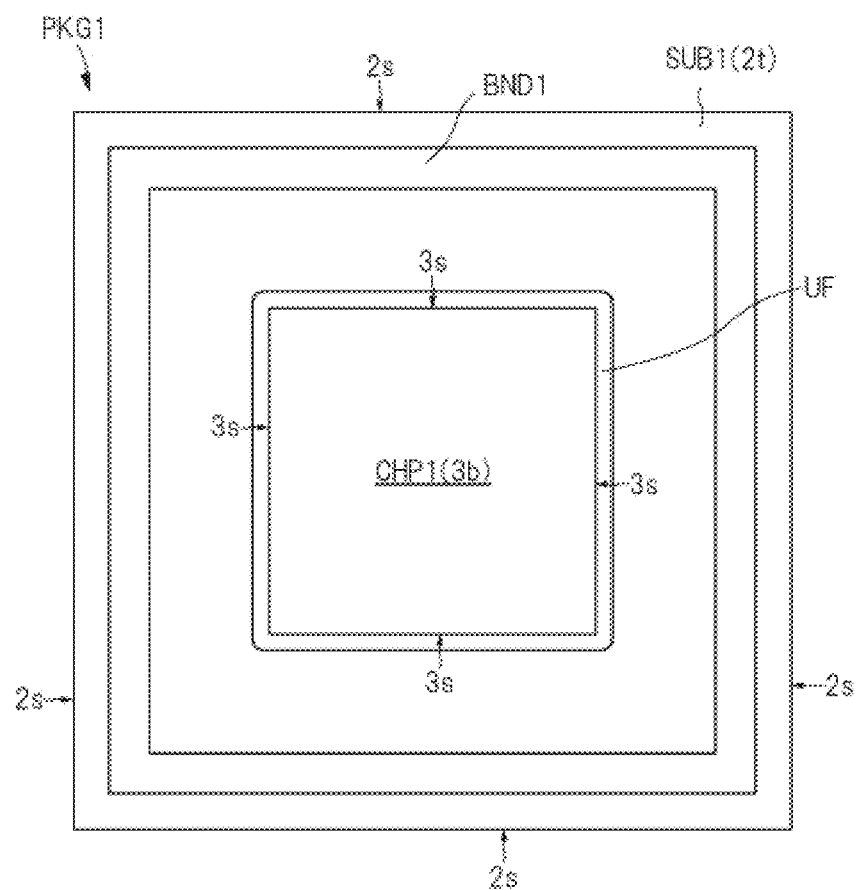
FIG. 5 is a plan view of the semiconductor device removing a cover member shown in FIG. 3.

FIG. 3 is an upper surface view of one of two semiconductor devices shown in FIG. 1. Also, FIG. 4 is a lower surface view of the semiconductor device shown in FIG. 3. Also, FIG. 5 is a plan view of the semiconductor device removing a cover member shown in FIG. 3. Further, FIG. 6 is a cross-sectional view along line A-A in FIG. 3.

The semiconductor device PKG1 of the present embodiment has a wiring substrate SUB1, a semiconductor-chip CHP1 mounted on the wiring substrate SUB1 (see FIG. 5), Semiconductor device PKG1 also has a heat dissipation sheet TIM disposed on the semiconductor chip CHP1, the entire semiconductor chip CHP1, the entire heat dissipation sheet TIM, and a cover member LID covering a portion of the wiring substrate SUB1. Although not shown, the technique described below can also be applied to a semiconductor device having no heat dissipating sheet TIM and the cover member LID.

Figure 6:
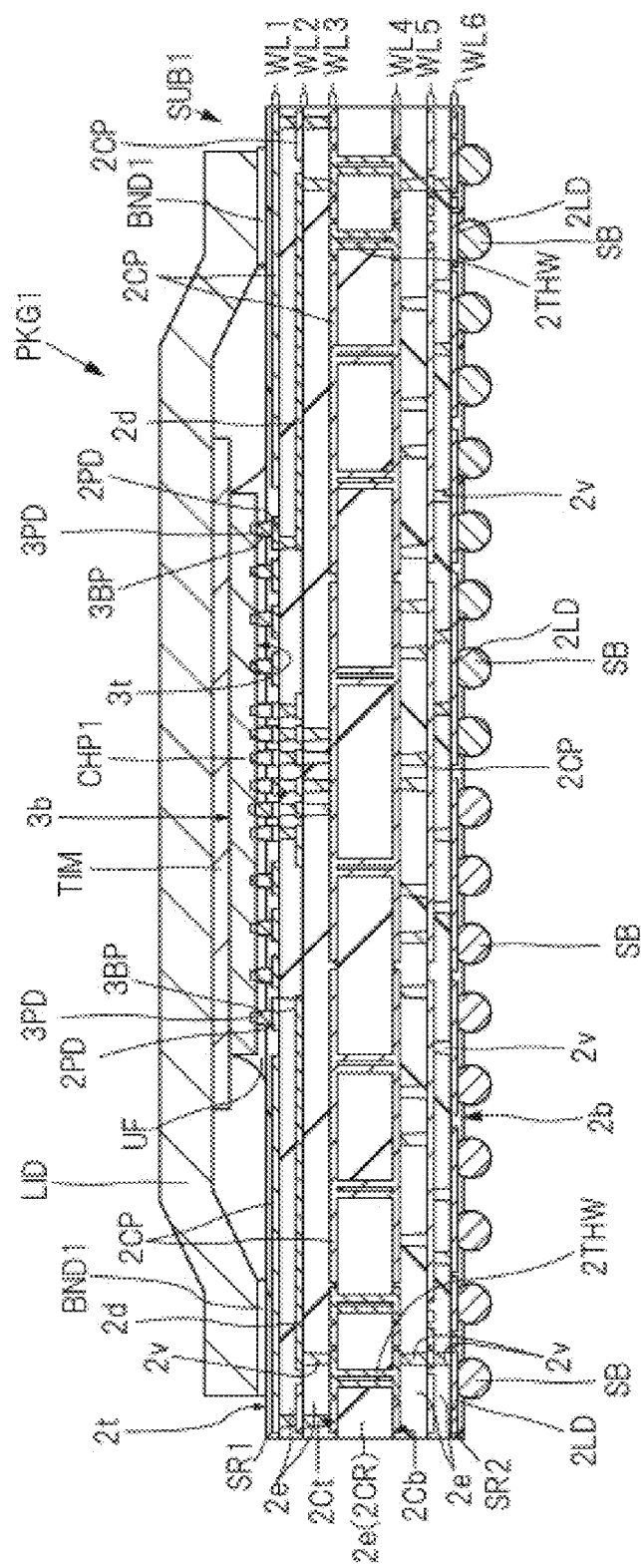
FIG. 6 is a cross-sectional view along line A-A in FIG. 3.

As shown in FIG. 6, the wiring substrate SUB1 has a upper surface semiconductor chip CHP1 is mounted (surface, main surface, chip mounting surface) 2t, the lower surface opposite to upper surface 2t (surface, main surface, mounting surface) 2b. Further, the wiring substrate SUB1 has a plurality of side surfaces 2s (see FIGS. 3 to 5) continuous to the respective outer edges of upper surface 2t and the lower surface 2b. For the present embodiment, upper surface 2t of the wiring substrate SUB1 (see FIG. 3) and the lower surface 2b (see FIG. 4) are each square. Upper surface 2t is a chip mounting surface facing the surface 3t of the semiconductor chip CHP1.

The wiring substrate SUB1 has a plurality of wiring layers (6 layers in the example shown in FIG. 6) WL1, WL2, WL3, WL4, WL5, and a WL6 for electrically connecting the terminal (pad 2PD) formed on the upper surface 2t, which is a chip mounting surface, and the terminal (land 2LD) formed the lower surface 2b, which is a mounting surface. Each wiring layer is located between the upper surface 2t and the lower surface 2b. Each wiring layer has a conductive pattern such as a wiring that is a path for supplying an electrical signal or power. Also, the insulating layer 2e is disposed between each wiring layer. Each the wiring layer is electrically connected to each other by way of a via wiring 2v or a through-hole wiring 2THW, that are an interlayer conductive path penetrating through the insulating layer 2e. In the present embodiment, the wiring substrate having a wiring layer of eight layers is exemplified as an example of the wiring substrate SUB1, the number of wiring layers provided by the wiring substrate SUB1 is not limited to eight layers. For example, a wiring substrate having five or less layers or seven or more layers of wiring layers can be used as modified example.

Further, among the plurality of wiring layers, the wiring layer WL1 disposed on the most upper surface 2t side is covered with the organic insulating film SR1. The organic insulating film SR1, an opening is provided, a plurality of pad WL1 provided a plurality of pad 2PD is exposed from the organic insulating film SR1 in the opening. Further, among the plurality of wiring layers, the wiring layer WL6 disposed at a position closest to the lower surface 2b side of the wiring substrate SUB1, a plurality of land 2LD is provided, the wiring layer WL6 is covered with the organic insulating film SR2. Each of the organic insulating film SR1 and the organic insulating film SR2 is a solder resist film. The plurality of pads 2PD provided in the wiring layer WL1 and the plurality of lands 2LD provided in the wiring layer WL6 are electrically connected with each other by way of the conductive pattern (wiring 2d or conductive pattern of large area) formed in the respective wiring layer of the wiring substrate SUB1, the via wiring 2v and the through-hole wiring 2THW.

Each of the wiring 2d, the pad 2PD, the via wiring 2v, the via land 2vL (refer to FIG. 9 to be described later), the through-hole wiring 2THW, the land 2LD, and the conductive pattern 2CP is made of copper or a metallic material mainly composed of, for example, copper.

Further, the wiring substrate SUB1 is formed by laminating a plurality of wiring layers on the upper surface 2Ct and the lower surface 2Cb, respectively, of the insulating layer (core material, core insulating layer) 2CR, which is made of, for example, prepreg impregnated with a resin to a glass fiber, by using a build-up method. Further, the wiring layer WL3 formed on the upper surface 2Ct of the insulating layer 2CR and the wiring layer WL4 formed on the lower surface 2Cb of the insulating layer 2CR are electrically connected with each other by way of a plurality of through-hole wiring 2THW that are embedded in a plurality of through-holes provided so as to reach from one of the upper surface 2Ct and the lower surface 2Cb to the other.

In the exemplary shown in FIG. 6, the wiring substrate SUB1 shows a wiring 2CR in which a plurality of wiring layers are laminated on upper surface 2Ct side and the lower surface 2Cb side of the insulating layer 2Cb which is a core material, respectively. However, as modified example with respect to FIG. 6, without an insulating layer 2CR made of a hard material such as preg material, formed by laminating a conductive pattern such as an insulating layer 2e and the wiring 2d in order, so-called, coreless substrate it may be used. When using a coreless substrate, the through-hole wiring 2THW is not formed, the wiring layers are electrically connected via the via wiring 2v.

Further, in the example shown in FIG. 6, each of the plurality of land 2LD, the solder balls (solder material, external terminals, electrodes, external electrodes) SB are connected. Solder balls SB, when mounting semiconductor device PKG1 on the motherboard (not shown), electrically connecting a plurality of terminals of the motherboard side (not shown) and a plurality of land 2LD, a conductive member. Solder balls SB, for example, lead (Pb) containing Sn—Pb solder material, or substantially free of Pb, so-called, a solder material made of lead-free solder. Examples of lead-free solders include, for example, tin (Sn), tin-bismuth (Sn—Bi), tin-copper-silver (Sn—Cu—Ag), tin-copper (Sn—Cu), and the like. Here, the lead-free solder means a solder in which the content of lead (Pb) is 0.1 wt % or less, and this content is determined as a standard of RoHS (Restriction of Hazardous Substances) instruction.

As shown in FIG. 4, the plurality of balls SBs are arranged in a matrix. Although not shown in FIG. 4, a plurality of lands 2LD (see FIG. 6) to which a plurality of solder balls SB are bonded are also arranged in a matrix form. Thus, on the mounting surface side of the wiring substrate SUB1, a semiconductor device for arranging a plurality of external terminals (solder balls SB, land 2LD) in a matrix, referred to as an area-array type semiconductor device. Area array type semiconductor device, the mounting surface of the wiring substrate SUB1 (lower surface 2b) side, it is possible to effectively utilize as the arrangement space of the external terminals, the mounting area of semiconductor device even if the number of external terminals is increased it is preferable in that it is possible to suppress an increase. In other words, a semiconductor device in which the number of external terminals increases as the function and integration become higher can be mounted in a space-saving manner.

Further, semiconductor device PKG1 includes a semiconductor-chip CHP1 mounted on the wiring substrate SUB1. As shown in FIG. 6, each of the semiconductor chip CHP1 includes a plurality of protruding electrode 3BP are arranged surface (main surface, upper surface) 3t, the back surface opposite to the surface 3t (main surface, the lower surface) 3b. The semiconductor chip CHP1 includes a plurality of side surfaces 3s intersecting the front surface 3t and the back surface 3b. Semiconductor chip CHP1 forms a square outer shape having a smaller planar area than the wiring substrate SUB1 in plan view as shown in FIG. 1n the example shown in FIG. 5, the semiconductor chip CHP1 is mounted on the central portion of substrate SUB1 of upper surface 2t, and, each of the four side surfaces 3s of the semiconductor chip CHP1 extends along each of the four side surfaces 2s of the wiring substrate SUB1.

Further, on the front surface 3t side of the semiconductor chip CHP1, a plurality of electrodes (pads, electrode pads, bonding pads) 3PD are formed. In the example shown in FIG. 6, the semiconductor chip CHP1, while the surface 3t is opposed to upper surface 2t of the wiring substrate SUB1 is mounted on the wiring substrate SUB1. Such a mounting method is called a face-down mounting method or a flip-chip connection method.

Although not shown, the main surface of the semiconductor chip CHP1 (specifically, the semiconductor element forming region provided on the element forming surface of semiconductor substrate is a substrate of the semiconductor chip CHP1), a plurality of semiconductor elements (circuit elements) are formed. A plurality of electrode 3PD, the inside of the semiconductor chip CHP1 (specifically, between the surface 3t and the semiconductor element forming region (not shown) via a wiring formed in the wiring layer disposed in, and the plurality of semiconductor elements, respectively electrically connected.

The semiconductor chip CHP1 (specifically, the substrate of the semiconductor chip CHP1) is made of, for example, silicon (Si). Further, the surface 3t, an insulating film covering the substrate and the wiring of the semiconductor chip CHP1 (passivation film 3PF shown in FIG. 9 to be described later) is formed, a portion of each of the plurality of electrode 3PD, in the opening formed in the passivation film, it is exposed from the passivation film. Each of the plurality of electrodes 3PD is made of a metal, and in the present embodiment, aluminum (Al), for example, is made of aluminum (Al).

Further, as shown in FIG. 6, each of the protruding electrode 3PD to the plurality of electrode 3BP is connected, a plurality of electrode 3PD of the semiconductor chip CHP1, the plurality of pad substrate SUB1 through a plurality of protruding electrode 3BP, are electrically connected, respectively. Projecting electrode (bump electrode) 3BP is a metal member formed so as to protrude on the surface 3t of the semiconductor chip CHP1 (conductive member). In the present embodiment, a pillar electrode made of copper, for example, is formed on an electrode 3PD, and a solder material is laminated on the end of the columnar electrode to form a protruding electrode 3BP. As the solder material laminated on the tip of the columnar electrode, a solder material containing lead or a lead-free solder can be used, similarly to the above-described solder ball SB.

When mounting the semiconductor chip CHP1 to the wiring substrate SUB1, good bonding material bonding between the solder to a plurality of pad 2PD (e.g., base metal film or solder paste) is formed in advance. By performing heat treatment (reflow process) while contacting the solder material at the end of the columnar electrode and the bonding material on the pad 2PD, the solder is integrated, the protruding electrode 3BP is formed. Further, as modified example for the present embodiment, columnar electrodes made of nickel (Ni), or micro-solder balls are formed through the underlayer metal film on the electrode 3PD, the so-called solder bumps may be used as the protruding electrode 3BP.

Further, between the semiconductor chip CHP1 and the wiring substrate SUB1 as shown in FIG. 6, underfill resin (insulating resin) UF is disposed. The underfill resin UF is disposed so as to close the space between upper surface 2t of the surface 3t and the wiring substrate SUB1 of the semiconductor chip CHP1. Each of the plurality of protrusion electrodes 3BP is sealed with the underfill resin UF. Further, the underfill resin UF is made of an insulating (non-conductive) material (e.g., a resin material), is disposed so as to seal the electrical connecting portion of the semiconductor chip CHP1 and the wiring substrate SUB1 (junction of the plurality of protruding electrode 3BP). Thus, by covering the junction between the plurality of protruding electrode 3BP and the plurality of pad 2PD with an underfill resin UF, it is possible to alleviate the stresses occurring in the electrically connecting portion of the semiconductor chip CHP1 and the wiring substrate SUB1. Further, it is possible to alleviate the stresses occurring at the junction between the plurality of electrode 3PD and the plurality of protruding electrode 3BP of the semiconductor chip CHP1. Furthermore, it is also possible to protect the main surface of the semiconductor device of the semiconductor chip CHP1 (circuit elements) is formed.

Further, on the back surface 3b of the semiconductor chip CHP1, the cover member (lid, heat spreader, heat radiating member) LID is disposed. Cover member LID, for example, a metal plate having a higher thermal conductivity than the wiring substrate SUB1, and a function of discharging heat generated in the semiconductor chip CHP1 to the outside. Further, the cover member LID is thermally connected to the semiconductor chip CHP1 through the heat radiating sheet TIM. Radiating sheet TIM is in contact with each of the semiconductor chip CHP1 and the cover member LID.

<Peripheral Structure of Pads of Wiring Board>

Figure 7:
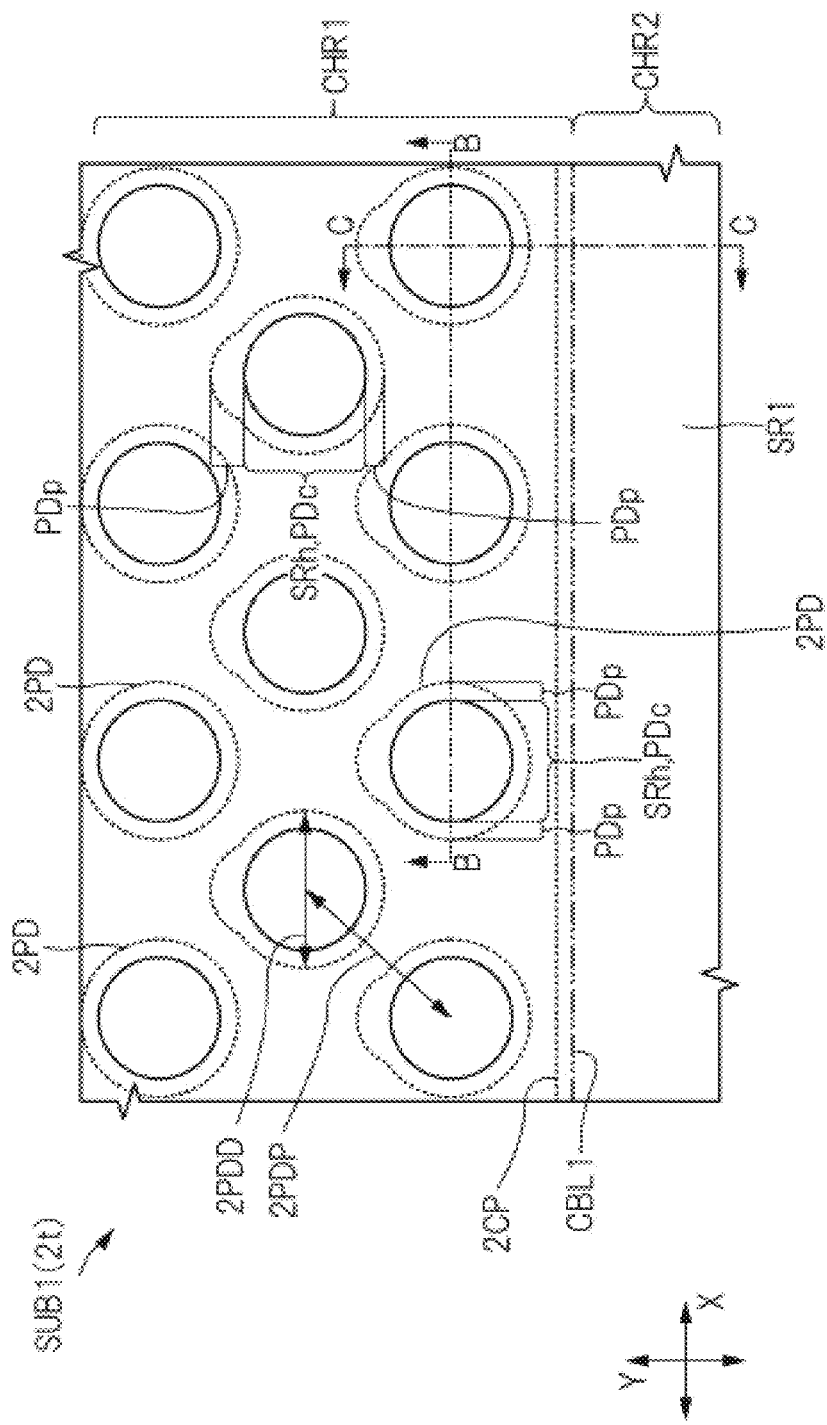
FIG. 7 is an enlarged plan view of an upper surface of the wire substrate shown in FIG. 6.
Figure 8:
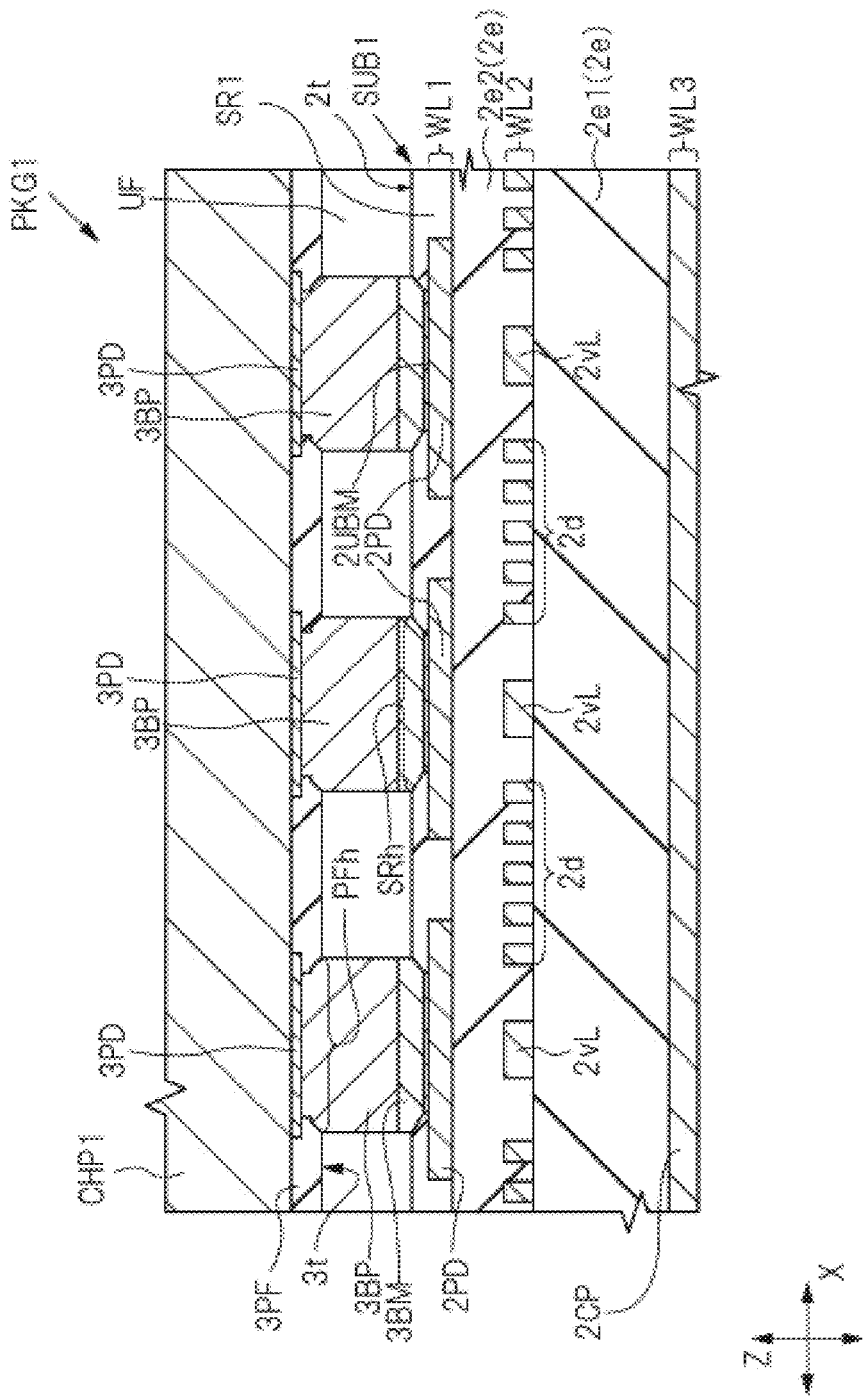
FIG. 8 is an enlarged cross-sectional view along line B-B in FIG. 7.
Figure 9:
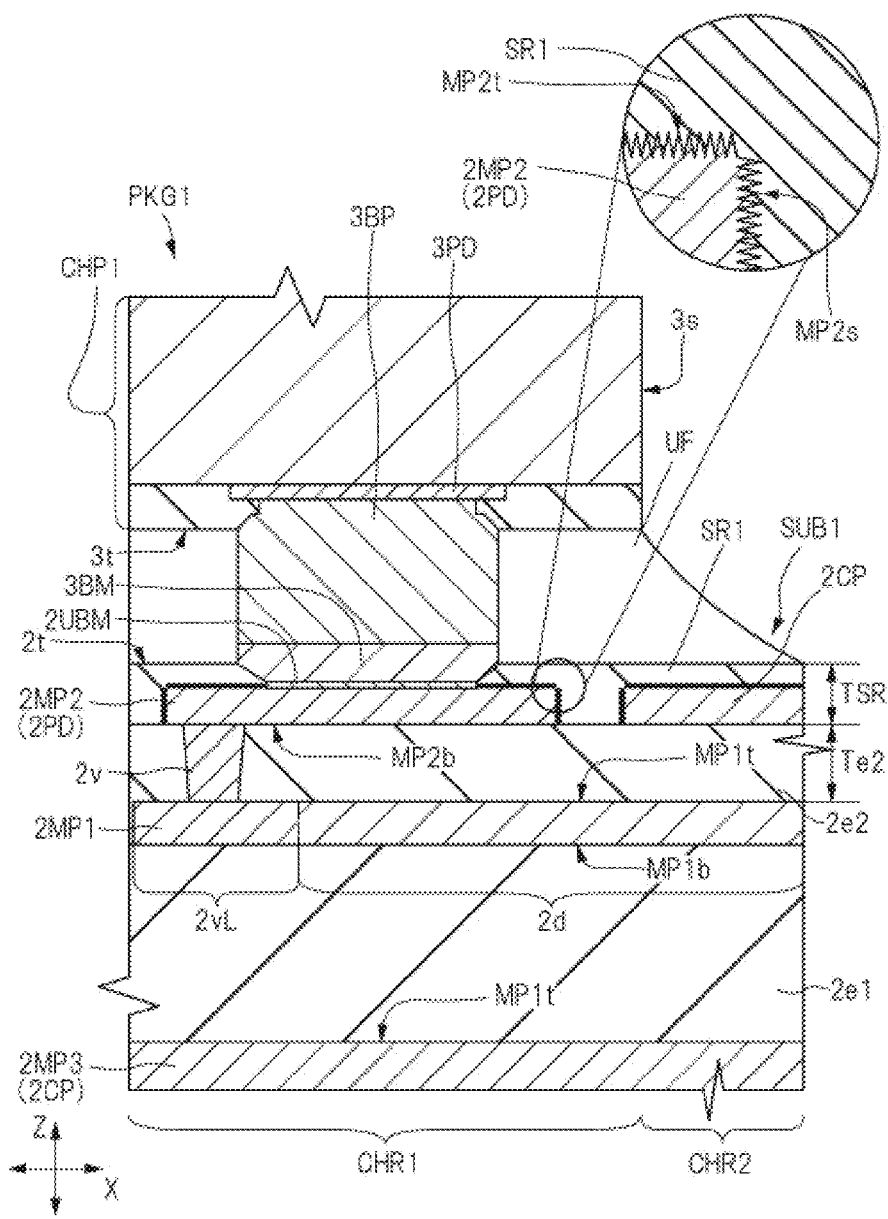
FIG. 9 is an enlarged cross-sectional view along line C-C in FIG. 7.
Figure 10:
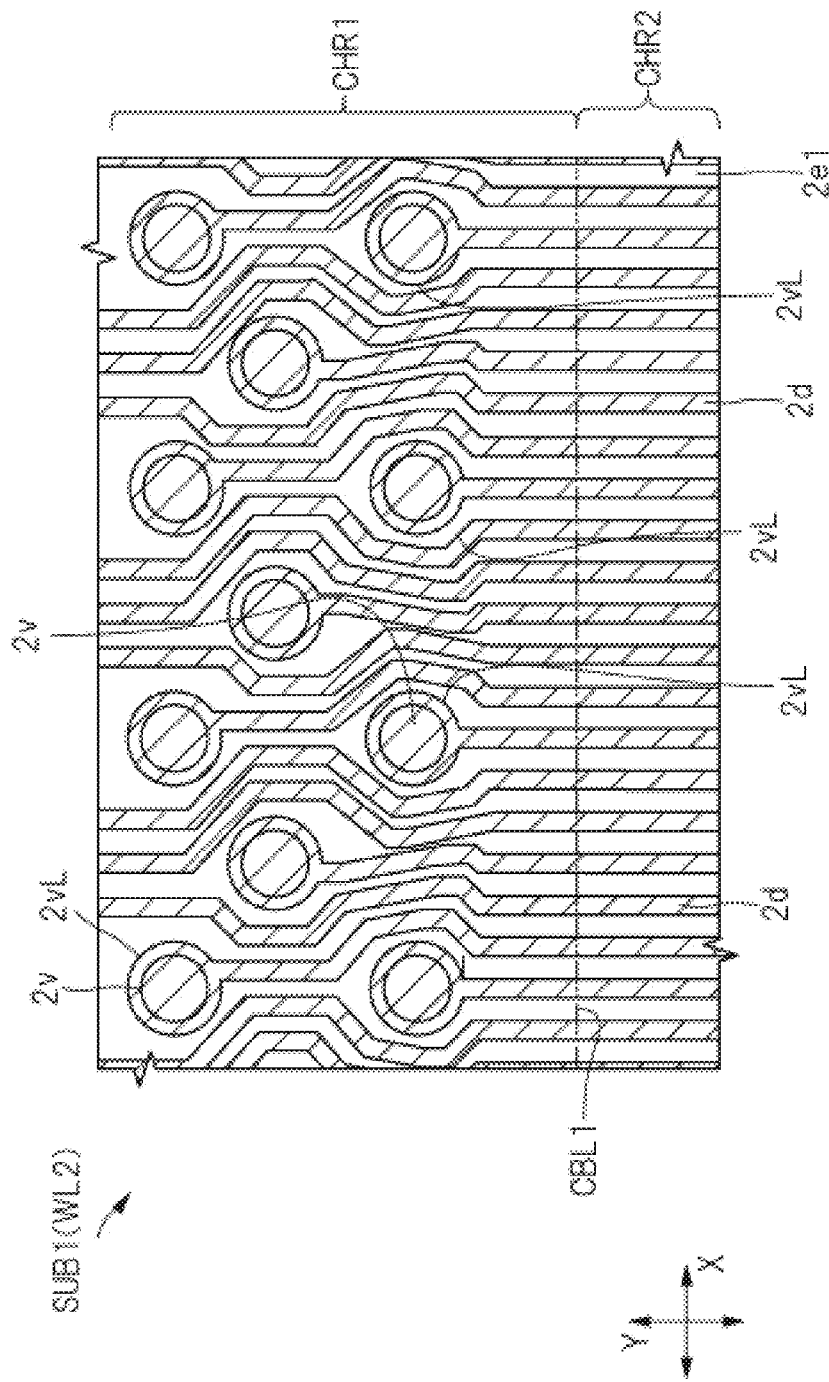
FIG. 10 is an enlarged plan view, which is corresponding to the enlarged plan view shown in FIG. 7, showing a configuration example of a metal pattern disposed in a second wiring layer shown in FIG. 9.

Next, the detailed structures around the connecting portions of the protruding electrodes 3BP shown in FIG. 6 will be described. FIG. 7 is an enlarged plan view of an upper surface of the wire substrate shown in FIG. 6. FIG. 8 is an enlarged cross-sectional view along line B-B in FIG. 7. FIG. 9 is an enlarged cross-sectional view along line C-C in FIG. 7. FIG. 10 is an enlarged plan view, which is corresponding to the enlarged plan view shown in FIG. 7, showing a configuration example of a metal pattern disposed in a second wiring layer shown in FIG. 9. In FIGS. 8 and 9, in order to show the positional relation between the projection electrode 3BP and the pad 2PD, the projection electrode 3BP connected to each of the plurality of pads 2PD is shown.

The upper surface 2t of the wiring substrate SUB1 shown in FIG. 7, and each of the plurality of wiring layers shown in FIG. 6, in a plan view viewed from the semiconductor chip CHP1, overlapping the semiconductor chip CHP1 region CHR1 (refer to FIG. 7), and does not overlap with the semiconductor chip CHP1, and a region CHR2 in the periphery of the region CHR1 (see FIG. 7). Further, each of the plurality of wiring layers, a boundary between the region CHR1 and the region CHR2, and a boundary line CBLI overlapping with any one of the side surfaces 3s of the semiconductor chip CHP1 (refer to FIG. 5) in plan view (see FIG. 7). In the following description, the text described with reference to the boundary line CBLI, the portion of the "boundary line CBLI" can be read as "one of the side surface 3s of the semiconductor chip CHP1 in a plan view as viewed from the semiconductor chip CHP1".

A plurality of pad 2PD as shown in FIG. 7, in the area CHR1 overlapping the semiconductor chip CHP1 (refer to FIG. 6), are arranged in a matrix (array-like, matrix-like). Although not shown by plan view, as shown in FIG. 8, each of the plurality of protruding electrode 3BP and a plurality of pad 2PD which are arranged on the surface 3t of the semiconductor chip CHP1 is disposed at a position facing each other. Similarly, each of the plurality of electrode 3PD and a plurality of pad 2PD arranged on the surface 3t of the semiconductor chip CHP1 is disposed at a position facing each other.

Each of the plurality of pads 2PD shown in FIG. 7 has a central portion (portion) PDe facing the protrusion electrode 3BP (refer to FIG. 8) and a peripheral portion (portion) PDp located around the central portion PDc. The peripheral portion PDp of each of the plurality of pad 2PD is covered with the organic insulating film SR1, and the central portion PDe of each of the plurality of pad 2PD is exposed from the organic insulating film SR1 in the opening portion SRh formed in the organic insulating film SR1. As shown in FIG. 9, the portion of the pad 2PD exposed from the opening portion SRh is bonded to the protruding electrode 3BP. The wiring substrate SUB1 has a plurality of pad 2PD, the transmission path of the electric signal (e.g., signal transmission path SGP shown in FIG. 2), the reference potential supply path VSP (see FIG. 2), or the power supply potential supply path VSD (see FIG. 2) It is included in.

As shown in FIG. 8, the surface 3t side of the semiconductor chip 3, the passivation film 3PF is formed. Passivation film 3PF is an indefinite insulating film having a surface 3t. An opening PFh is formed in the passivation film 3PF, and the electrodes 3PD are exposed from the passivation film 3PF in the opening PFh. One end portion of the protruding electrode 3BP is in contact with the electrode 3PD. The other end of the protruding electrodes 3BP is in contact with the bonding material 3BM made of solders.

On the upper surface 2t side of the wiring substrate SUB1, the organic insulating film SR1 is formed. The organic insulating film is a solder resist film having a characteristic of suppressing the wetting and spreading of solder. The organic insulating film SR1 has upper surface 2t. A plurality of opening portions SRh is formed in the organic insulating film SR1, and the pad 2PD is exposed from the organic insulating film SR1 in the opening portion SRh. A metal film 2UBM is formed on the exposed surface of the pads 2PD. The metal film 2UBM is called an under-bump metal, and is a film provided to improve electric connecting characteristics between the protruding electrodes 3BP and the pads 2PD. Projection electrode 3BP and the metal film 2UBM is electrically connected via a solder (bonding material 3BM).

As described with reference to FIGS. 1 and 2, since the high-frequency signal is transmitted to the signal transmission path SGP, the signal transmission path SGP, noise countermeasures are necessary. For example, in the example shown in FIG. 9, the wiring 2d constituting a part of the signal transmission path SGP (see FIG. 2) is disposed in the wiring layer WL2 (see FIG. 6). In the thickness direction of the wiring substrate SUB1, the wiring 2d is disposed between the conductive pattern 2CP formed on the wiring layer WL1, the conductive pattern 2CP formed on the wiring layer WL3 (see FIG. 6). Reference potential is supplied to the conductive pattern 2CP. The conductive pattern to which the reference potential is supplied is referred to as a ground plane. Wiring structure illustrated in FIG. 9 is referred to as a stripline structure, the ground plane disposed so as to sandwich the wiring 2d, electromagnetic waves generated by the high-frequency signal is transmitted to the wiring 2d functions as an electromagnetic shield to prevent diffusing around.

Further, when semiconductor device PKG1 used for signal transmission applications at high speeds, in addition to the high frequency of one signal transmission path SGP, there is also a request to widen the bus width by increasing the number of signal transmission path SGP. In order to increase the number of signaling paths SGPs, the number of pads 2PD needs to be increased. However, due to the need for miniaturization for semiconductor device, the overall sizing of semiconductor device PKG1 needs to be suppressed even when the padding 2PD is increased. As a result, the arrangement densities of the plurality of pads 2PD are increased. In the exemplary embodiment shown in FIG. 7, the diameter 2PDD of each of the plurality of pad 2PD is, for example, about 90 μm to 150 μm, whereas the smallest value of the center-to-center distance 2PDP of adjacent pad 2PD is about 110% to 130% relative to the diameter 2PDD.

As shown in FIG. 7, when the arrangement densities of a plurality of pads 2PD are increased, a technique for preventing short-circuiting between adjacent pads 2PD is required. For example, in the example shown in FIG. 8, when the adhesion interface between the organic insulating film SR1 and the pad 2PD is peeled off, there is a case where the solder penetrates into the gap generated by the peeling. When the peeling progresses in the planar directions, the mutually adjacent pads 2PD may communicate with each other by a gap generated by the peeling, depending on the extent of the peeling. When solder penetrates into this communicating gap, there is a fear that adjacent pad 2PD is short-circuited through the solder.

From the viewpoint of preventing the short circuit as described above, it is preferable to improve the adhesion between the pads 2PD and the organic insulating film SR1. Therefore, the inventor of the present application, among the pad 2PD, by roughening the surface in contact with the organic insulating film SR1, was examined to suppress the peeling between the pad 2PD and the organic insulating film SR1.

Incidentally, it is preferable to improve the adhesion between the metal pattern and the insulating layer containing an organic material such as a resin from the viewpoint of protecting the damage of the metal pattern. If it is possible to prevent peeling between the metal pattern and the insulating layer, the external force caused by the development of peeling, it is possible to prevent the metal pattern is broken. From this point of view, the roughened metal pattern, not only the pad 2PD shown in FIG. 8, the contact interface between the respective and the insulating layer 2e2 of the plurality of wires 2d formed in the wiring layer WL2 (see FIG. 6) is also preferably roughened.

However, according to the studies of the present inventors, the signal transmission path, particularly when roughening the surface roughness of the wiring 2d constituting the transmission path of the high-frequency signal, it was found that the transmission loss is increased. Further, for high density, there is a tendency that the wiring width of the wiring 2d becomes narrower. In a state where the wiring width of the wiring 2d is narrow, when roughening the surface roughness, it causes a decrease in accuracy when molding the pattern. If the shape accuracy of the wiring pattern in the signal transmission path is reduced, variations in the signal transmission characteristics occur.

Based on the above examination results, the construction of semiconductor device PKG1 of the present embodiment will be described with reference to FIG. 9. In the following description, the metal pattern formed on the wiring layer WL1 (see FIG. 6) will be described as a metal pattern 2MP2. The metal pattern 2MP2 corresponds to any one of the plurality of pads 2PD. Further, a metal pattern formed in the wiring layer WL2 (see FIG. 6) will be described as a metal pattern 2MP1. The metal pattern 2MP1 corresponds to a pattern having the via land 2vL and the wiring 2d that are integrally formed with each other, the conductive pattern 2CP (see FIG. 6), etc. Further, although detailed will be described later, the metal pattern formed in the wiring layer WL3 (see FIG. 6) will be described as a metal pattern 2MP3. The metal pattern 2MP3, a plurality of conducive pattern 2CP power supply potential or reference potential is supplied, through-hole lands connected to the through-hole wiring 2THW shown in FIG. 6 (reference numeral is omitted) and the like corresponds.

As shown in FIG. 9, the semiconductor device PKG1 has a semiconductor chip CHP1, and a wiring substrate SUB1 having a upper surface 2t facing the surface 3t of the semiconductor chip CHP1. Wiring substrate SUB1 includes an insulating layer 2e1, and a metal pattern 2MP1 formed on the insulating layer 2e1. The wiring substrate SUB1 is in contact with the metal pattern 2MP1, and includes an insulating layer 2e2 formed on the insulating layer 2e1 so as to cover the metal pattern 2MP1, and a metal pattern 2MP2 formed on the insulating layer 2e2. The metal pattern 2MP2 is provided with a first portion (central portion PDc shown in FIG. 7) facing the protruding electrode 3BP and a second portion (surrounding portion PDp shown in FIG. 7) around first portion. The wiring substrate SUB1 is in contact with second portion of the metal pattern 2MP2, and includes an organic insulating film formed on the insulating layer 2e2 so that first portion of the metal pattern 2MP2 is exposed. The metal pattern 2MP1 has a lower surface MP1b in contact with the insulating layer 2e1, located on the opposite side of the lower surface MP1b, and a upper surface MP1t in contact with the insulating layer 2e2. The Metal pattern 2MP2 has a lower surface MP2b in contact with the insulating layer 2e2, and a upper surface MP2t in contact with the organic insulating film in second portion. The surface roughness of 2MP2 of the metal pattern upper surface MP2t is larger than that of the lower surface MP2b of the metal pattern, upper surface MP1t of the metal pattern 2MP1, and the lower surface MP1b, respectively.

For example, when the index of the surface roughness is expressed using Ra, which is an arithmetic average roughness, the following range is preferable. The surface roughness (Ra) of upper surface MP2t of the metal pattern 2MP2 is preferably 0.3 μm or more. On the other hand, the lower surface MP2b of the metal pattern 2MP2, upper surface MP1t of the metal pattern 2MP1, and the lower surface MP1b, the respective surface roughness Ra is preferable less than 0.3 μm.

The above-mentioned arithmetic average roughness Ra is calculated as follows. First, extracting the reference length L in the direction of the average line from the roughness curve of the surface. Next, the X-axis in the direction of the average line of the extracted portion, taking the Y-axis in a direction perpendicular to the average line, represents the roughness curve by y=f(x). At this time, Ra, which is the arithmetic average roughness, is calculated by the following equation.

$$Ra = \frac{1}{L}\int_0^L |f(x)|dx \qquad \text{[EQUATION 1]}$$

For the configuration described above, first, the peeling of the organic insulating film SR1, the surface roughening of the pad 2PD of the wiring layer WL1 short circuit of adjacent pad 2PD is most likely to occur (see FIG. 6). On the other hand, the lower surface MP2b of the metal pattern 2MP2 not in contact with the organic insulating film SR1, upper surface MP1t of the metal pattern 2MP1, and the surface roughness of each of the lower surface MP1b is smaller than the surface roughness of the pad 2PD. Therefore, for example, even when the high-frequency signal is transmitted to the wiring 2d shown in FIG. 9, it is possible to reduce the transmission loss.

An example of the method for roughening the surface roughness of the pad 2PD (i.e., metal pattern 2MP2) includes a sandblasting process. This is a method of roughening the surface roughness of a target by causing a group of fine particles made of an inorganic material to collide with the target.

It is preferable that the surface on which the process for roughening the surface roughness (hereinafter, referred to as the roughening treatment) is performed contains at least upper surface MP2t of the pad 2PD. Upper surface MP2t is a surface easily become a starting point of peeling of the organic insulating film SR1. Further, if it is possible to prevent peeling in upper surface MP2t, it is possible to prevent the penetration of the bonding material 3BM made of solder.

Further, in the example shown in FIG. 9, the metal pattern 2MP2 has a side surface MP2s which is connected to the upper surface MP2t and is in contact with the organic insulating film SR1. The surface roughness of the side surface 2s of the metal pattern 2MP2 is larger than the respective surface roughness of the lower surface MP2b of the metal pattern 2MP2, upper surface MP1t of the metal pattern 2MP1, and the lower surface MP1b. Surface roughness of the side surface 2s of the metal pattern 2MP2 is comparable to the surface roughness of upper surface MP2t, Ra is arithmetic mean roughness is preferably 0.3 μm or more. By the surface roughness of the side MP2s to the same extent as the surface roughness of upper surface MP2t, it is possible to prevent the peeling mode peeling generated in the side MP2s is developed to upper surface MP2t side. However, although illustration is omitted, as a modified example with respect to FIG. 9, the side surface MP2s is not subjected to the roughening treatment, and upper surface MP2t is selectively subjected to the roughening treatment in some cases. Even in this modified example, peeling from upper surface MP2t as a starting point can be prevented.

Further, the wiring layer WL1 (see FIG. 6), in addition to the pad 2PD, a metal pattern such as a conductive pattern 2CP is formed. Only a plurality of pad 2PD formed on the wiring layer upper surface MP2t of the pad WL1, or may be selectively roughened to some of the plurality of pad 2PD. However, from the viewpoint of suppressing the peeling between the metal pattern formed on the organic insulating film SR1 and the wiring layer WL1, including upper surface of the conductive pattern 2CP, it is particularly preferable to perform the roughening treatment for all of the plurality of metal patterns formed on the wiring layer WL1. In this case, the surface roughness of upper surface of all the metal patterns formed on the wiring layer WL1 is greater than the lower surface MP2b of the metal pattern 2MP2, upper surface MP1t of the metal pattern 2MP1, and the lower surface MP1b, respectively of the surface roughness.

Further, as shown in FIG. 9, the metal film 2UBM is formed on the central portion of the metal pattern 2MP2 (portion), and the protruding electrode 3BP and the metal film 2UBM is electrically connected via a solder (bonding material 3BM). In this case, when peeling (interfacial peeling) occurs at the interface between upper surface MP2t and the organic insulating film SR1 of the metal pattern 2MP2, peeling propagates (progresses) into the organic insulating film SR1, the organic insulating film SR1 there is a possibility that solder penetrates into the gap propagated to.

Further, in the transmission path of the high-frequency signal described above, reducing the transmission loss by reducing the surface roughness is more effective for the pattern extending long like the wiring pattern. In case of FIG. 9, the protruding electrode 3BP is electrically connected to the metal pattern 2MP1. The metal pattern 2MP1 is electrically connected to the metal pattern 2MP2 by way of the via wiring 2v formed so as to penetrate through the insulating layer 2e2. The metal pattern 2MP1 includes a via land (via land portion) 2vL to which the via wiring 2v is connected, and a wiring (wiring portion) 2d formed integrally with the via land 2vL and extending along the X direction.

Further, as shown in FIG. 7, the pad 2PD corresponding to the metal pattern 2MP2 (see FIG. 9), in a plan view, are disposed in the area CHR1 overlapping the semiconductor chip CHP1. As shown in FIG. 10, the wires 2d of the metal pattern 2MP1, in plan view, extend from the region CHR1 toward the region CHR2 that is around the region CHR1. In other words, the interconnection 2d straddles the border line CBLI between the region CHR1 and the region CHR2. In other words, in plan view, the pad 2PD does not overlap the side surface 3s of the semiconductor chip CHP1 (refer to FIG. 9) (see FIG. 9), and the wiring 2d overlaps with one of the side surfaces 3s of the semiconductor chip CHP1.

The length of the wiring 2d shown in FIG. 9 is longer than the respective lengths of the metal pattern 2MP2, the via wiring 2v, and the via land 2vL. In the above, the length of the wiring 2d, of the wiring 2d, from the connection portion between the via lands 2vL shown in FIG. 9, is defined as the length to the connection portion between the via wiring 2v connecting the wiring layer WL2 and the wiring layer WL3 shown in FIG. The length of the metal pattern 2MP2 is defined as the length from the connection portion between the protruding electrode 2BP shown in FIG. 9 to the connection portion between the via wiring 2v connecting the wiring layer WL1 and the wiring layer WL2. The length of the via wiring 2v is defined as the length of the via wiring 2v in the Z direction shown in FIG. 9. The length of the via land 2vL is defined as the length from the connecting portion of the via lands 2vL, which is connected to the via wiring 2v connecting between the wiring layer WL1 and the wiring layer WL2, to the connecting portion of the via lands 2vL, which is connected to the wiring 2d. Further, the metal pattern 2MP1 and the metal pattern 2MP2, an electric signal (e.g., signal SGT or signal SGR shown in FIG. 1) is transmitted. In other words, the metal pattern 2MP1 and the metal pattern 2MP2 are included in the signal transmission path SGP (see FIG. 2). Further, in the present embodiment, the electric signal flowing through the signal transmission path SGP is a high-frequency signal of 30 GHz (gigahertz) or more. Therefore, of the transmission path of the high-frequency signal of more than 30 GHZ, the portion extending longer than the other portion of the transmission path (portion corresponding to the wiring 2d), when increasing the roughness of the surface, the insulating layer 2e1 and the insulating layer 2e2 in contact with this portion (wiring 2d) adhesion is improved, but susceptible to transmission loss due to this roughening. That is, the skin effect of the high-frequency signal (the higher the frequency signal, the scattering loss due to the phenomenon that the current only flows on the surface of the wiring) is increased. On the other hand, according to the present embodiment, the surface roughness of the wire 2d constituting the signal transmission path, for example, since small than the surface roughness of upper surface MP2t of the metal pattern 2MP2, it is possible to reduce the transmission loss.

Peeling of the metal pattern and the insulating film is generated due to the difference in linear expansion coefficient caused by the material constituting each member. Therefore, when the difference in the linear expansion coefficient between the metal pattern and the insulating film is small, peeling hardly occurs, if the difference in the linear expansion coefficient is large, peeling is likely to occur. For example, in the example shown in FIG. 9, the thermal expansion coefficient of the organic insulating film SR1 (specifically, the linear expansion coefficient) is greater than the thermal expansion coefficient of the insulating layer 2e2 (specifically, the linear expansion coefficient). Also, the storage modulus of the organic insulating film SR1 is softer than the storage modulus of the insulating layer 2e2. In addition to the electric insulating properties, the organic insulating film SR1 is required to function as a solder resist film as described above. In addition, since the organic insulating film SR1 is a film located on the outermost surface of the materials constituting the interconnection substrate SUB1, it is also required to function as a protective film. On the other hand, the insulating layer 2e1 and the insulating layer 2e2 located in the inner layer of the wiring substrate SUB1 than the organic insulating film SR1, in addition to the electrically insulating properties, so that the warpage and deformation of the wiring substrate SUB1 can be suppressed, high stiffness is required. Therefore, by selecting the material so that the thermal expansion coefficient of the insulating layer 2e2 is reduced, it is preferable to approach the thermal expansion coefficient of the metal pattern 2MP1. Thus, it is possible to reduce the generation of peeling at the interface between the metal pattern 2MP1 and the insulating layer 2e2. On the other hand, the interface between the organic insulating film SR1 and the metal pattern 2MP2, it is possible to suppress the generation of peeling by increasing the surface roughness of upper surface MP2t as described above.

Further, as an example shown in FIG. 6, when the metal pattern formed on the wiring layer WL3 (metal pattern 2MP3 shown in FIG. 9) is formed on the insulating layer 2CR is a core insulating layer, peeling at the interface between the insulating layer 2CR and the metal pattern 2MP3 is difficult to occur. As described above, the insulating layer 2CR is an insulating layer made of a prepreg obtained by impregnating glass fibers with a resin. In this case, it is possible to reduce the linear expansion coefficient of the insulating layer 2CR. On the other hand, the organic insulating film SR1, the insulating layer 2e1, and the insulating layer 2e2 do not contain fiberglass. Therefore, the organic insulating film SR1, the respective linear expansion coefficients of the insulating layer 2e1 and the insulating layer 2e2 is larger than the linear expansion coefficient of the insulating layer 2CR.

Further, as shown in FIG. 9, the thickness TSR of the organic insulating film SR1 is thinner than the thickness Te2 of the insulating layer 2e2. The organic insulating film SR1, which is relatively thinner than the insulating layer 2e2, tends to expand or contract in accordance with environmental temperatures more easily than the insulating layer 2e2. Therefore, the adhesion interface between the organic insulating film SR1 and the metal pattern 2MP2, it is particularly essential to take peeling countermeasures by roughening treatment.

Figure 11:
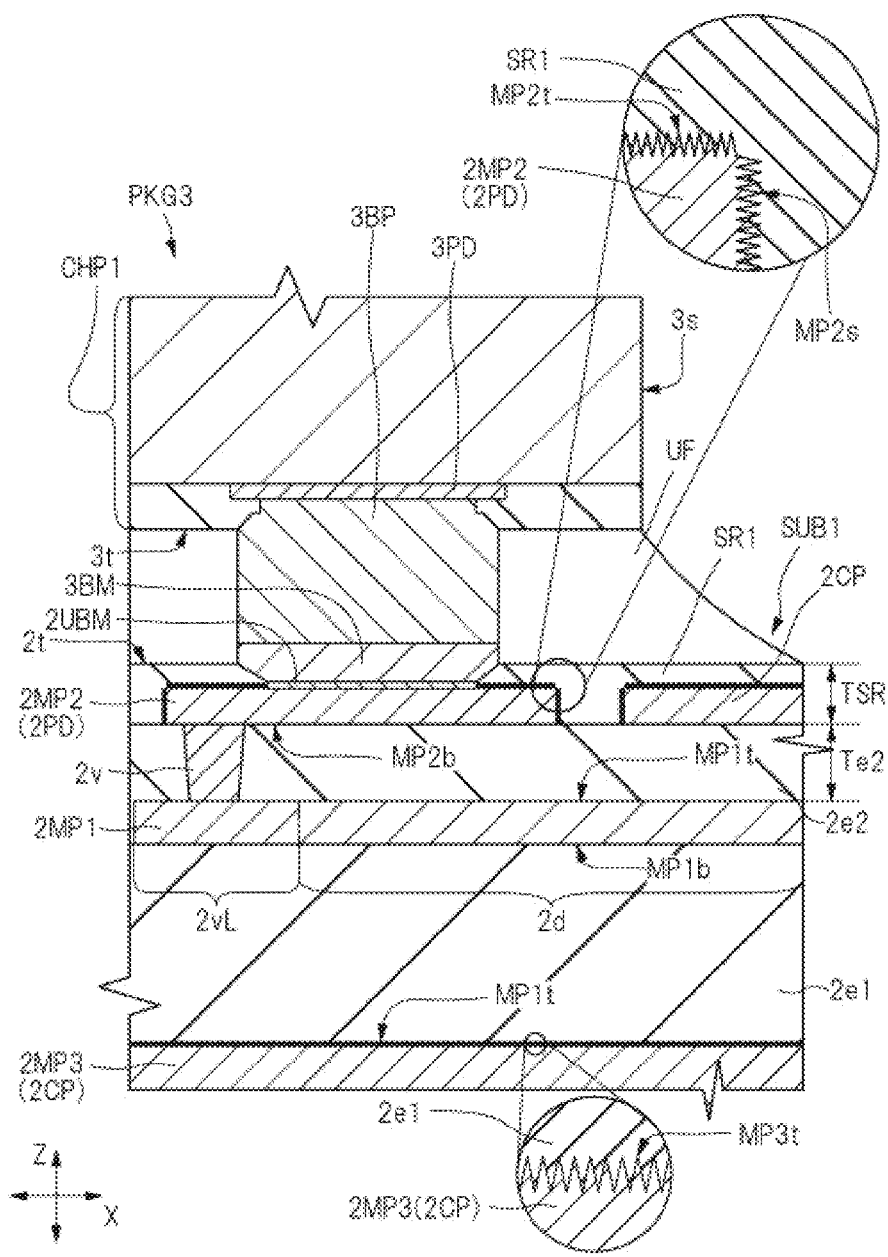
FIG. 11 is an enlarged cross-sectional view showing a modified example with respect to FIG. 9.

FIG. 11 is an enlarged cross-sectional view showing a modified example with respect to FIG. 9. The semiconductor device PKG3 shown in FIG. 11 is the same as 2MP3 PKG1 shown in FIG. 9 except that upper surface MP3t of the metal pattern 2MP3 is subjected to roughening treatment as described below. Therefore, duplicate descriptions are omitted. Semiconductor device PKG3 shown in FIG. 11 further includes a core insulating layer 2CR (see FIG. 6) and a metal pattern 2MP3 formed on the insulating layer 2CR. The metal pattern 2MP3 is a conductive pattern 2CP formed on the wiring layer WL3 (see FIG. 6). The conductive pattern 2CP, although the reference potential or power supply potential is supplied, the reference potential is supplied to the conductive pattern 2CP shown in FIG. The metal pattern 2MP3 has an insulating layer 2CR (see FIG. 6) abutting lower surface MP3*b*, and located on the opposite side of the lower surface MP3*b*, and the upper surface MP3*t* in contact with the insulating layer 2*e*1. The surface roughness of 2MP3 of the metal pattern upper surface MP3*t* is larger than that of the lower surface 2MP2 of the metal pattern MP2*b*, upper surface MP It of the metal pattern 2MP1, and the lower surface MP1*b*, respectively. For example, the metal pattern 2MP3 is subjected to the roughening treatment similar to that of the metal pattern 2MP2, and the surface roughness (Ra) of upper surface MP3*t* is preferably 0.3 μm or more. As for the supply path of the reference potential, it is less susceptible to transmission loss due to roughening compared with the signal transmission path. On the other hand, the metal pattern 2MP3, when compared with the wire 2*d*, is a pattern of a large area having an area of three times or more. Large-area metal pattern 2MP3 have large stresses generated when they are thermally shrunk or thermally expanded. Therefore, peeling is likely to occur at the adhesion interface between the metal pattern 2MP3 and the insulating layer 2*e*1 due to stresses. Therefore, it is preferable that the metal pattern 2MP3 is subjected to a roughening treatment in the same manner as the metal pattern 2MP2.

However, even when peeling occurs between the metal-pattern 2MP3 and the insulating layer 2*e*1, it is not immediately insulation failure or the like occurs. Therefore, the order of precedence of the roughening treatment is higher in the metal pattern 2MP1 than in the metal pattern 2MP3. Therefore, as in semiconductor device PKG1 shown in FIG. 9, the surface roughness of upper surface MP3*t* of the metal pattern 2MP3 may be comparable to the surface roughness of upper surface MP It of the metal pattern 2MP1.

Figure 12:
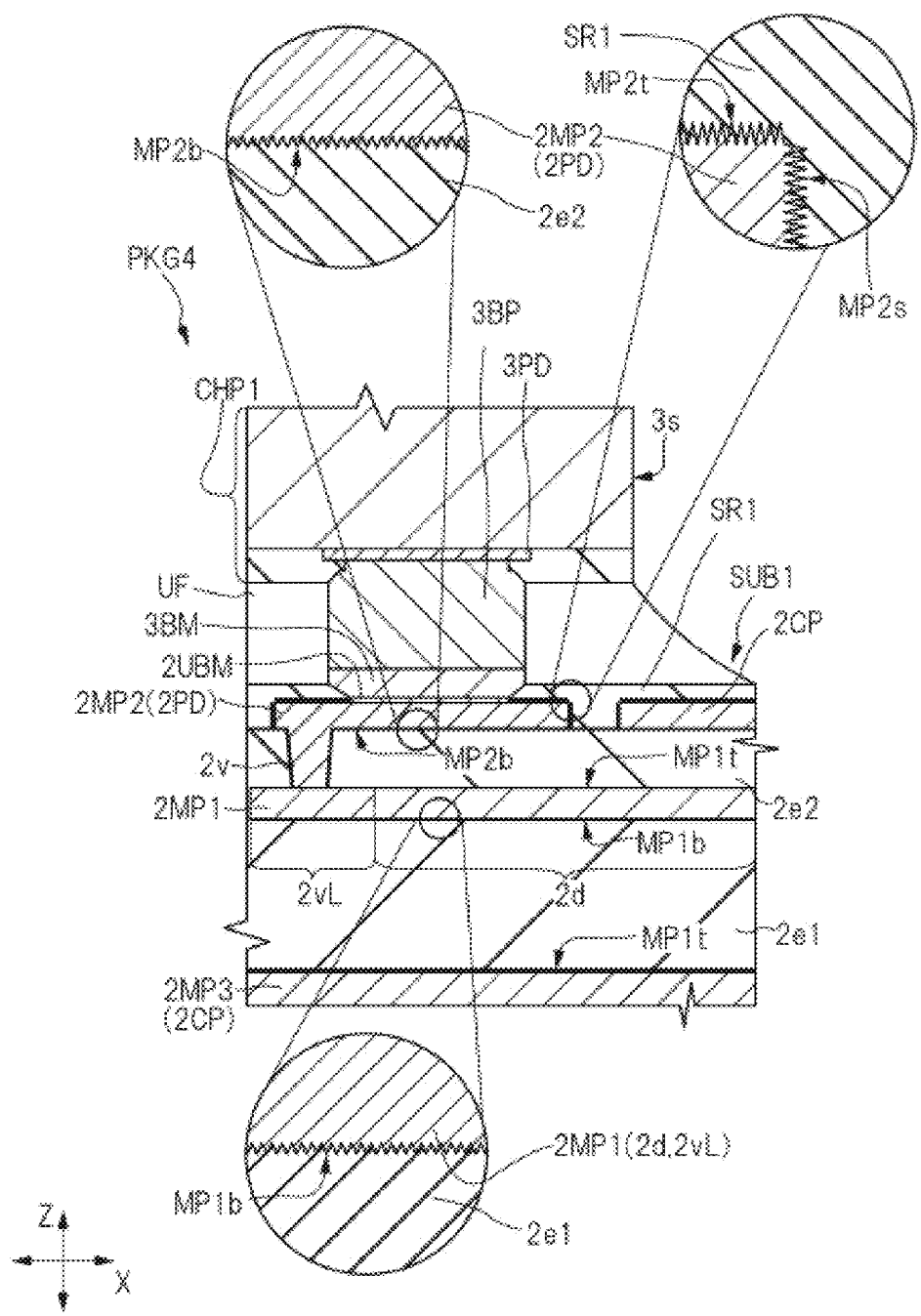
FIG. 12 is an enlarged cross-sectional view showing a modified example with respect to FIG. 11.

Incidentally, in FIG. 9, upper surface MP2*t* of the metal pattern 2MP2, the side MP2*s*, and the surface of the metal pattern other than upper surface MP3*t* of the metal pattern 2MP3 is illustrated as a flat surface. However, when a step called a desmear process is performed in the process of manufacturing the interconnection substrate SUB1, the other surface may not be a flat surface. FIG. 12 is an enlarged cross-sectional view showing a modified example with respect to FIG. 11. Incidentally, semiconductor device PKG4 shown in FIG. 12 is the same as semiconductor device PKG3 shown in FIG. 11 except that it includes an uneven surface caused by the desmear process described below. Therefore, duplicate descriptions are omitted.

In the manufacturing process of the wiring substrate SUB1, for example, when adopting a build-up method, after forming an insulating layer on the wiring layer of the lower layer, subjected to drilling for providing the via wiring 2*v*. At this time, in order to remove the residue of the insulating layer remaining after the drilling process, for example, the non-treated surface is irradiated with plasma. This process is referred to as desmear processing (sometimes referred to as plasma desmear processing). By performing the desmear treatment, the adhesiveness between the metal film and the insulating layer can be improved. On the other hand, since the plasma is irradiated to the insulating layer in the desmear process, the surface roughness of the insulating layer is an underlayer of the metal pattern is larger when compared with the case without the desmear process. When a metal pattern is formed after the desmear treatment, the lower surface of the metal pattern becomes uneven surface following the unevenness of the desmear processed insulating layer.

As shown in FIG. 12, each of the lower surface MP1*b* of the metal pattern 2MP1 and the lower surface MP2*b* of the metal pattern 2MP2 has an uneven surface due to desmear treatment rather than a flat surface. However, in the case of the uneven surface caused by the desmear process, it is possible to suppress the surface roughness from becoming extremely large as compared with the roughening treatment such as the sand blasting treatment described above. Therefore, even in modified example shown in FIG. 12, the following can be said. That is, the surface roughness of 2MP2 of the metal pattern upper surface MP2*t* is larger than the lower surface MP2*b* of the metal pattern, upper surface MP1*t* of the metal pattern 2MP1, and the lower surface MP1*b*, respectively. Also, the surface roughness of the side surface 2*s* of the metal pattern 2MP2, the lower surface MP2*b* of the metal pattern 2MP2, upper surface MP1*t* of the metal pattern 2MP1, and the lower surface MP1*b*, greater than the respective surface roughness of. Also, the surface roughness of 2MP3 of the metal pattern upper surface MP3*t* is larger than the respective surface roughness of the lower surface MP2*b* of the metal pattern 2MP2, upper surface MP1*t* of the metal pattern 2MP1, and the lower surface MP1*b*.

Further, in semiconductor device PKG4 of modified example shown in FIG. 12, in that it does not perform the roughening treatment on the metal-pattern 2MP1 is the same as semiconductor device PKG1 shown in FIG. Therefore, the surface roughness and the surface roughness of the lower surface MP1*b* of upper surface MP1*t* of the metal pattern 2MP1 the following relations hold. That is, the surface roughness of upper surface MP1*t* of the metal pattern 2MP1 is smaller than the surface roughness of the lower surface MP1*b* of the metal pattern 2MP1. Also, the surface roughness of upper surface MP1*t* of the metal pattern 2MP1 is smaller than the respective surface roughness of upper surface MP2*t*, the lower surface MP2*b*, and the side MP2*s* of the metal pattern 2MP2.

Although the invention made by the present inventor has been specifically described based on the embodiment, the present invention is not limited to the above embodiment, and it is needless to say that various modifications can be made without departing from the gist thereof.

What is claimed is:

1. A semiconductor device comprising:
   a semiconductor chip having a first surface on which a protruding electrode is disposed; and
   a wiring substrate having a second surface facing the first surface of the semiconductor chip,
   wherein the wiring substrate includes:
      a first insulating layer;
      a first metal pattern formed on the first insulating layer;
      a second insulating layer contacted with the first metal pattern, and formed on the first insulating layer so as to cover the first metal pattern;
      a second metal pattern having a first portion facing the protruding electrode and a second portion located around the first portion, and formed on the second insulating layer;
      an organic insulating film contacted with the second portion of the second metal pattern, and formed on the second insulating layer so as to expose the first portion of the second metal pattern;
      a third insulating layer; and
      a third metal pattern formed on the third insulating and to which a reference potential is to be supplied,
   wherein the first metal pattern has:
      a first lower surface contacted with the first insulating layer; and
      a first upper surface opposite the first lower surface, and contacted with the second insulating layer,
   wherein the second metal pattern has:

a second lower surface contacted with the second insulating layer; and a second upper surface contacted with the organic insulating film at the second portion, wherein the third metal pattern has:

a third lower surface contacted with the third insulating layer; and a third upper surface opposite the third lower surface, and contacted with the first insulating layer, wherein a surface roughness of the second upper surface of the second metal pattern is larger than a surface roughness of each of the second lower surface of the second metal pattern and the first upper surface of the first metal pattern, and wherein a surface roughness of the third upper surface of the third metal pattern is larger than the surface roughness of each of the second lower surface of the second metal pattern and the first upper surface of the first metal pattern.

2. The semiconductor device according to claim 1, wherein the protruding electrode is electrically connected with the first metal pattern, wherein the first metal pattern is electrically connected the second metal pattern by way of a via wiring formed so as to penetrating through the second insulating layer, and wherein the first metal pattern includes:

a via land portion to which the via wiring is connected; and a wiring portion formed integrally with the via land portion, and extended in a first direction.

3. The semiconductor device according to claim 2, wherein the second metal pattern is located in a first region with which the semiconductor chip is overlapped, and wherein, in plan view, the wiring portion of the first metal pattern is extended from the first region toward a second region located around the first region.

4. The semiconductor device according to claim 2, wherein the first metal pattern and the second metal pattern are included in a signal transmission path.

5. The semiconductor device according to claim 4, wherein a length of the wiring portion is longer than a length of each of the second metal pattern, the via wiring and the via land portion, and wherein an electrical signal flowing the signal transmission path is a high-frequency signal of 30 GHz or more.

6. The semiconductor device according to claim 1, wherein the surface roughness of the second upper surface of the second metal pattern is larger than each of the surface roughness of the second lower surface of the second metal pattern, the surface roughness of the first upper surface of the first metal pattern and a surface roughness of the first lower surface of the first metal pattern, and wherein the surface roughness of the third upper surface of the third metal pattern is larger than each of the surface roughness of the second lower surface of the second metal pattern, the surface roughness of the first upper surface of the first metal pattern, and a surface roughness of the first lower surface of the first metal pattern.

7. The semiconductor device according to claim 1, wherein a thermal expansion coefficient of the organic insulating film is larger than a thermal expansion coefficient of the second insulating layer.

8. The semiconductor device according to claim 7, wherein a linear expansion coefficient of the organic insulating film is larger than a linear expansion coefficient of the second insulating layer.

9. The semiconductor device according to claim 1, wherein the third insulating layer has a glass fiber therein, but each of the organic insulating film, the first insulating layer and the second insulating layer has no glass fiber therein.

10. The semiconductor device according to claim 1, wherein a thickness of the organic insulating film is thinner than a thickness of the second insulating layer.

11. The semiconductor device according to claim 1, wherein the surface roughness of the first upper surface of the first metal pattern is smaller than the surface roughness of the first lower surface of the first metal pattern.

12. The semiconductor device according to claim 1, wherein a metal film is formed on the first portion of the second metal pattern, and wherein the protruding electrode and the metal film are electrically connected with each other by way of a solder.

13. The semiconductor device according to claim 1, wherein the second metal pattern has a side surface connected to the second upper surface, and contacted with the organic insulating film, and wherein a surface roughness of the side surface of the second metal pattern is larger than the surface roughness of each of the second lower surface of the second metal pattern, the first upper surface of the first metal pattern and the first lower surface of the first metal pattern.

* * * * *